United States Patent

Suzuki et al.

[11] Patent Number: 5,845,200
[45] Date of Patent: Dec. 1, 1998

[54] METHOD AND AN APPARATUS FOR AUTOMATICALLY TUNING A RECEIVER

[75] Inventors: Toru Suzuki, Yokohama; Atsuhiko Hashigaya, Kakegawa, both of Japan

[73] Assignee: Matsushita Electric Industrial Co., Ltd., Osaka, Japan

[21] Appl. No.: 667,032

[22] Filed: Jun. 19, 1996

[30] Foreign Application Priority Data

Dec. 25, 1995 [JP] Japan .................................. 7-336599

[51] Int. Cl.⁶ ............................... H04B 1/16; H04B 1/18
[52] U.S. Cl. ................................... 455/195.1; 455/184.1; 455/185.1
[58] Field of Search .......................... 455/161.1, 184.1, 455/185.1, 186.1, 193.1, 195.1, 197.2

[56] References Cited

U.S. PATENT DOCUMENTS

| | | | |
|---|---|---|---|
| 4,031,491 | 6/1977 | Sakamoto | 455/185.1 |
| 4,317,225 | 2/1982 | Henderson et al. | 455/184.1 |
| 4,370,629 | 1/1983 | Martin | 455/186.1 |
| 4,780,909 | 10/1988 | Sakashita et al. | 455/185.1 |
| 5,483,688 | 1/1996 | English et al. | 455/195.1 |

*Primary Examiner*—Nguyen Vo
*Assistant Examiner*—Sam Bhattacharya
*Attorney, Agent, or Firm*—Lowe Hauptman Gopstein Gilman & Berner

[57] ABSTRACT

An automatic tuning apparatus for a receiver has a tuning unit, a ROM and a voltage converting unit. At the time of adjustment of the tuning unit, tuning voltages are supplied to the tuning unit from a CPU and stored in the ROM as reference tuning voltages at which tunings of the tuning unit become optimum at both ends of a receiving frequency band of the receiver. In a normal use, the reference tuning voltages stored in the ROM are supplied to the voltage converting unit through the CPU. The voltage converting unit converts the reference tuning voltages into a tuning voltage of a desired receiving channel according to a predetermined format, and supplies it to the tuning unit, thereby optimizing a tuning by the tuning unit.

12 Claims, 4 Drawing Sheets

METHOD AND AN APPARATUS FOR AUTOMATICALLY TUNING A RECEIVER

BACKGROUND OF THE INVENTION (1) Field of the Invention

The present invention relates to a method and an apparatus for automatically tuning a receiver.

(2) Description of the Related Art

FIG. 3 shows a structure of a harmonic tuning circuit as an example of a general automatic tuning apparatus of a receiver. In FIG. 3, reference numeral 1 denotes a receiving antenna, 2 a high-frequency amplifier for amplifying a received radiowave, 3 a tuner configured with a variable-capacitance diode 3a, a coil 3b and a variable capacitor 3c, 4 a mixer for converting a frequency of the received radiowave, 5 a local oscillator whose oscillating frequency is controlled by a CPU 7, 6 a ROM in which local-oscillator frequency data and a tuning voltage of each receiving channel are stored, and 7 the CPU for controlling read/write of the ROM 6 and the local oscillator 5. FIG. 4 shows a frequency (f)-tuning voltage (Vf) characteristic curve of the tuner 3.

Description will be next made of an operation of the above automatic tuning apparatus with the above arrangement. A radiowave received by the receiving antenna 1 is amplified by the high-frequency amplifier 2, passes through the tuner 3, and is supplied to the mixer 4. The mixer 4 converts a frequency of the received radiowave to obtain an IF (intermediate frequency) output. Oscillating frequency data of each receiving channel stored in the ROM 6 is supplied to the local oscillator 5 through the CPU 7 to control an oscillating frequency of the local oscillator 5 for each received channel. A tuning voltage for each receiving channel stored in the ROM 6 is, as well as the oscillating frequency, supplied as a tuning voltage to the variable-capacitance diode 3a of the tuner 3 through the CPU 7. A tuning voltage for each receiving channel is stored in advance in the ROM 6 on the basis of a frequency-tuning voltage characteristic curve of the tuner 3 obtained from a characteristic of the variable-capacitance diode, as shown in FIG. 4. In the case of a current selective receiver used in Japan, there are 320 receiving channels for each 25 kHz within a frequency band from 276 to 284 MHz. In which case, it is necessary to store 320 tuning voltages for respective receiving channels obtained from the frequency-tuning voltage characteristic curve shown in FIG. 4 in the ROM 6. In consequence, 320 tuning voltages obtained on the basis of the frequency-tuning voltage characteristic curve in FIG. 4 are, in advance, stored in the ROM 6. The variable capacitor 3c of the tuner 3 is served to correct variation of the coil 3b, which is so adjusted that a tuning of the tuner 3 becomes optimum at a specific frequency when the tuner 3 is adjusted, whereby the frequency-tuning voltage characteristic curve stored in advance in the ROM 6 coincides with an actual characteristic curve of the tuner 3.

A tuning voltage for each receiving channel is supplied to the variable-capacitance diode 3a as stated above to optimize a tuning of the tuner 3 for each receiving channel.

The above general automatic tuning apparatus has, however, a problem that it is necessary to store tuning voltages in number equal to the number of received channels in the ROM. The general automatic tuning apparatus therefore requires a considerable capacity of the ROM to implement the automatic tuning. In addition, the variable capacitor served to correct variation of the coil requires mechanical adjustment from the outside of the receiver, which accounts for a large proportion in the whole steps for the adjustment. Further, if a change occurs in an inclination of the frequency-tuning voltage characteristic curve stored in the ROM due to variation in the variable-capacitance diode characteristic or the like, there are some cases where an optimum tuning cannot be obtained on a receiving channel away from the adjusted specific frequency.

In the light of the above problem, an object of the present invention is to provide a method and apparatus for automatically tuning a receiver, which can minimize a capacity of the ROM, correct variation of parts in the tuner without necessity of mechanical adjustment and optimize a tuning of the tuner for each receiving channel.

SUMMARY OF THE INVENTION

In an aspect of the present invention, an automatic tuning method used in an automatic tuning apparatus of a receiver, which supplies a tuning voltage for a desired receiving channel among two or more receiving channels to a tuning unit to optimize a tuning thereof, which method comprising the steps of obtaining a pair of tuning voltages at a first frequency corresponding to a channel in a lower order and a second frequency corresponding to a channel in a higher order within a receiving frequency band of said tuning unit at which tunings of said tuning unit are optimum when said tuning unit is adjusted, storing said pair of tuning voltages corresponding to said first and second frequencies as reference tuning voltages used to determine a tuning voltage of the desired channel within the receiving frequency band in a storage means, determining a tuning voltage corresponding to a frequency of the desired receiving channel according to an order of the desired receiving channel on the basis of said values of said pair of tuning reference voltages stored in said storing means when selectively receiving the desired receiving channel among said two or more receiving channels, and supplying the determined tuning voltage to said tuning unit, thereby optimizing the tuning for the desired receiving channel.

In another aspect of the present invention, an automatic tuning apparatus of a receiver supplying a tuning voltage for a desired receiving channel among two or more receiving channels to a tuning unit to optimize a tuning thereof comprising a tuning unit for obtaining a pair of tuning voltages at a first frequency corresponding to a channel in a lower order and a second frequency corresponding to a channel in a higher order within a receiving frequency band of said tuning unit at which tunings of said tuning unit are optimum when said tuning unit is adjusted, a storing means for storing values of said pair of tuning voltages corresponding to said first and second frequencies as reference tuning voltages, and a voltage converting means for determining a tuning voltage corresponding to a frequency of said desired receiving channel according to an order of said desired receiving channel on the basis of said values of said pair of reference tuning voltages stored in said storing means when said receiver selectively receives the desired receiving channel among said two or more receiving channels.

According to this invention, tuning voltages at which tunings of the tuning unit are optimum at respective two points within a receiving frequency band of the receiver are stored in the ROM as reference tuning voltages when the tuning unit is adjusted. In a normal use, the reference tuning voltages are converted into a tuning voltage of a desired receiving channel using a predetermined format, and is supplied to the tuning unit, thereby minimizing a capacity of the ROM, correcting variation of parts of the tuning unit without necessity of mechanical adjustment and optimizing a tuning of the tuning unit for each receiving channel. This may further realize an automatic adjustment, a small size and a low cost of the receiver.

DESCRIPTION OF THE PREFERRED EMBODIMENT

Figure 1:
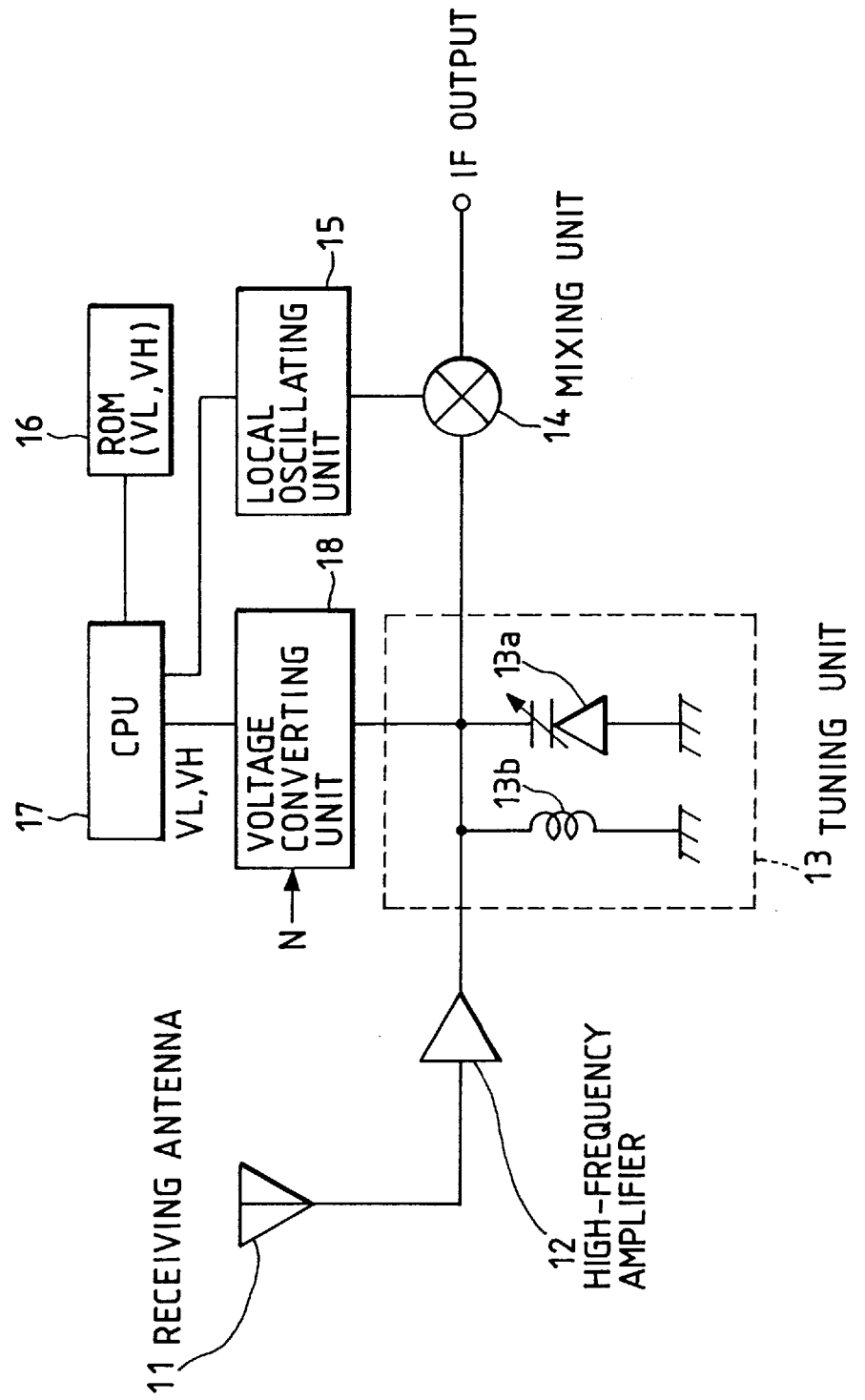
FIG. 1 is a block diagram of a high-frequency tuning circuit as an automatic tuning apparatus according to an embodiment of this invention.
Figure 2:
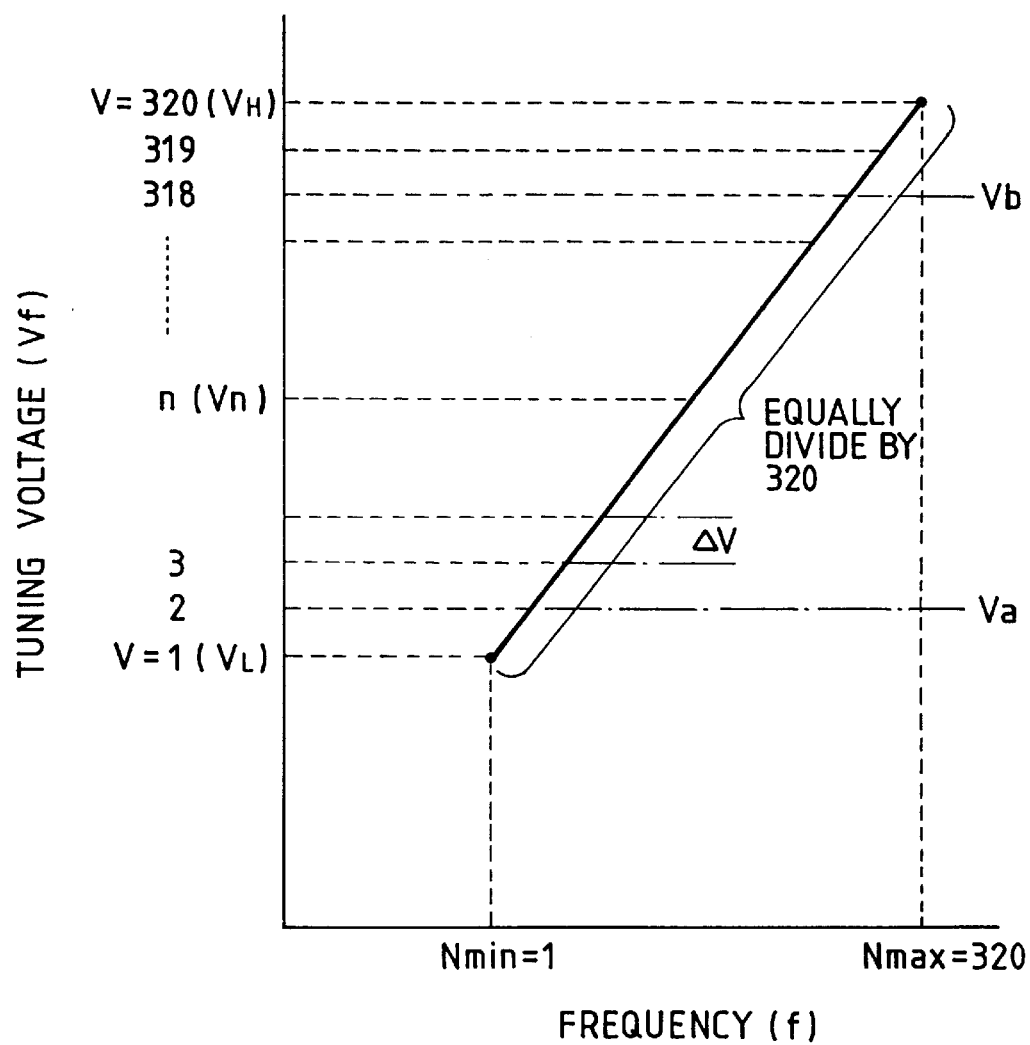
FIG. 2 is a graph showing how a tuning voltage for each receiving channel is obtained from reference tuning voltages in a voltage converting unit according to the embodiment.
Figure 3:
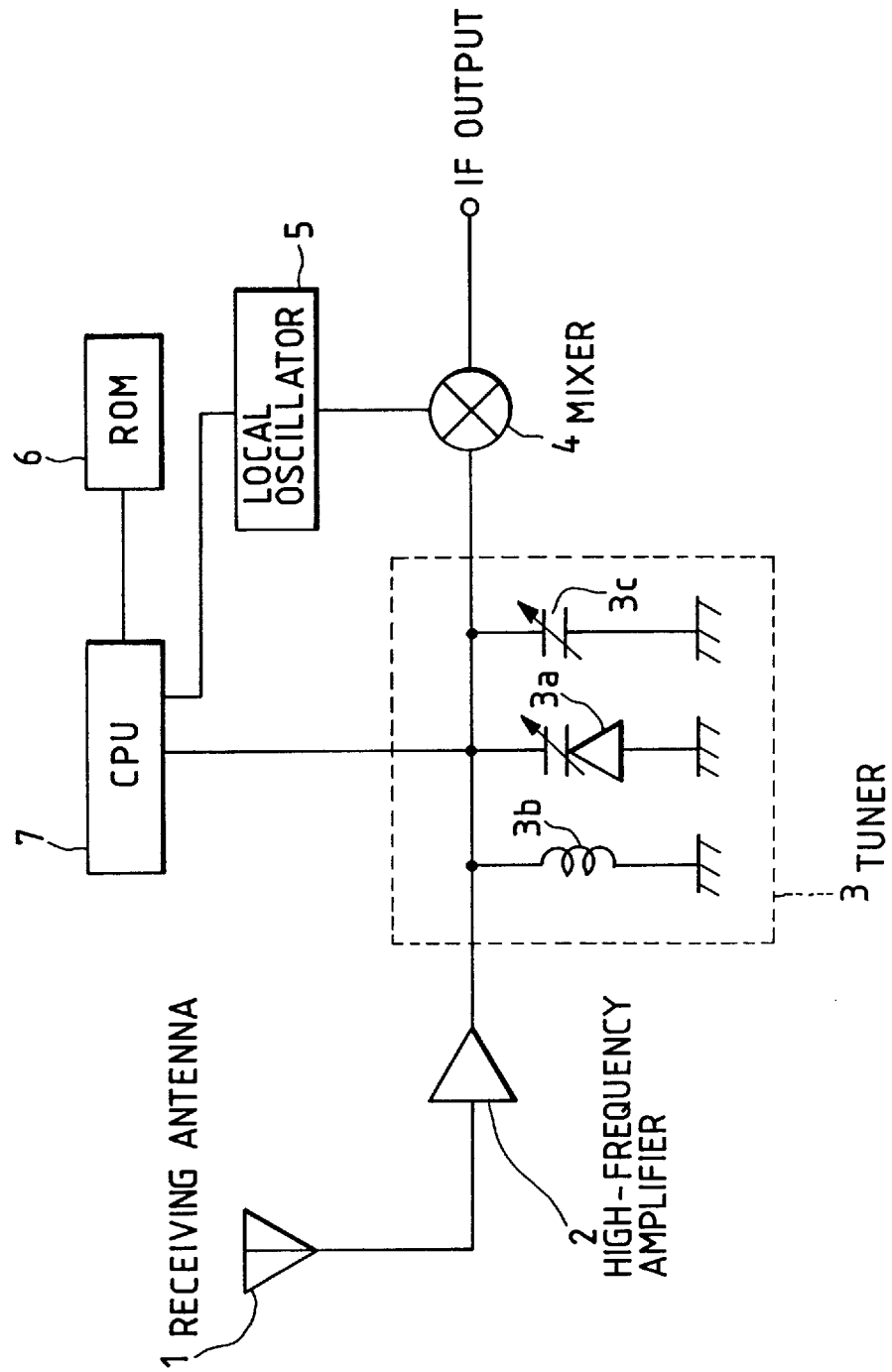
FIG. 3 is a schematic block diagram of an example of a high-frequency tuning circuit as a general automatic tuner in a receiver.
Figure 4:
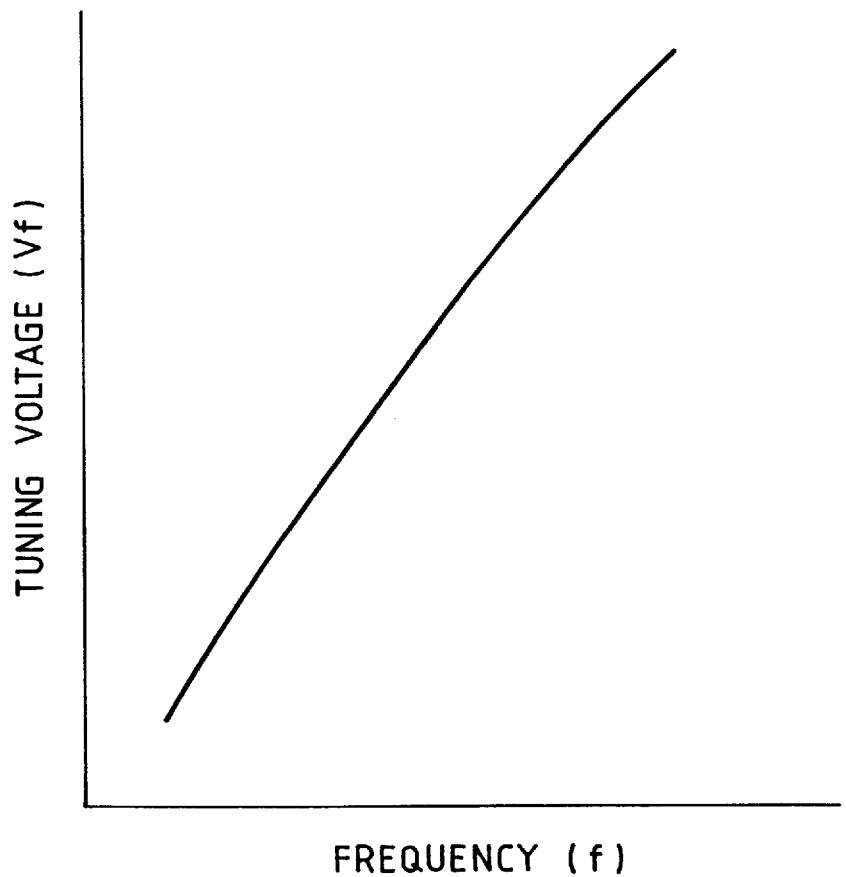
FIG. 4 shows a frequency (f)-tuning voltage (Vf) characteristic curve of the tuner of the general automatic tuning apparatus for the purpose of illustrating an operation of the general automatic tuning apparatus.

FIG. 1 shows a structure of a high-frequency tuning circuit as an example of an automatic tuning apparatus of a receiver according to an embodiment of this invention. In FIG. 1, reference numeral 11 denotes a receiving antenna, 12 a high-frequency amplifying unit, 13 a tuning unit configured with a variable-capacitance diode 13a and a coil 13b, 14 a mixing unit, 15 a local oscillating unit, 16 a ROM in which local-oscillator oscillating frequency data and tuning voltages are stored, 17 a CPU, and 18 a voltage converting unit for converting tuning reference voltages into a tuning voltage for a desired receiving channel using a predetermined format. FIG. 2 shows how the voltage converting unit 18 converts the tuning reference voltages $V_L$ and $V_H$ into a tuning voltage $V_n$ for a desired channel having a channel number n to obtain the same. Assuming here that there are N (320, for example) channels within a receiving frequency band and serial numbers (from 1 to N) are given to the respective receiving channels.

Description will be next made of an operation of the automatic tuning apparatus according to this embodiment with reference to FIGS. 1 and 2. The radiowave received by the receiving antenna 11 is amplified by the high-frequency amplifier 12, and passes through the tuning unit 13, then is supplied to the mixing unit 14. The mixing unit 14 converts a frequency of the received radiowave to obtain an IF (intermediate frequency) output. At the time of adjustment, a tuning voltage at which a tuning of the tuning unit 13 is optimum at the lowest frequency within the frequency band of the receiver is obtained as a first reference tuning voltage $V_L$, while a tuning voltage at which the tuning of the tuning unit 13 is optimum at the highest frequency is obtained as a second reference tuning voltage $V_H$, then values of the first reference tuning voltage $V_L$ and the second reference tuning voltage $V_H$ are stored in the ROM through the CPU 17. In a normal use, the first reference tuning voltage $V_L$ and the second reference tuning voltage $V_H$ stored in the ROM 16 are supplied through the CPU 17 to the voltage converting unit 18. The voltage converting unit 18 converts the first reference tuning voltage $V_L$ and the second reference tuning voltage $V_H$ into a tuning voltage for a desired channel n using a predetermined format.

An example of the converting format will be now described with reference to FIG. 2 by way of a current selective calling receiver used in Japan having 320 channels for each 25 kHz within a frequency band of 276 through 284 MHz. According to this embodiment, a region between the first reference tuning voltage $V_L$ and the second reference tuning voltage $V_H$ is equally divided by the number of receiving channels (320), then the first reference tuning voltage $V_L$ is assigned to a tuning voltage $V_1$ for the first channel and the second reference tuning voltage $V_{320}$ is assigned to a tuning voltage $V_{320}$ for the 320th channel. Then the region between the first reference tuning voltage $V_L$ and the second reference tuning voltage $V_H$ is divided equally and obtained values are assigned to tuning voltages for respective other channels (2nd to 319th) by calculating the following equation (1) in the voltage converting unit 18. If a difference $\Delta V$ in voltage between two adjacent channels is expressed as:

$$\Delta V = \frac{V_H - V_L}{N_{max}},$$

a tuning voltage $V_n$ for a desired receiving channel n is given by:

$$V_n = V_L + \frac{V_H - V_L}{N_{max}} \cdot (n-1) \qquad (1)$$
$$= V_L + \Delta V(n-1)$$

wherein $N_{max}$ is the largest number of the receiving channels.

A tuning voltage $V_n$ of a desired receiving channel obtained through the conversion format by calculating the above equation (1) is supplied from the voltage converting unit 18 to the variable-capacitance diode 13a of the tuning unit 13. The tuning voltage $V_n$ obtained in the above manner allows an optimum tuning for each receiving channel.

In the above example, the minimum value $N_{min}$ and the maximum value $N_{max}$ of the receiving frequency band are assigned to the first reference tuning voltages $V_L$ and the second reference tuning voltages $V_H$, respectively, of the receiving channels. However, it is alternatively possible to use two points $V_a$ and $V_b$ in voltage corresponding to two arbitrary receiving channels, respectively, within a range between the minimum value $N_{min}$ and the maximum value $N_{max}$ to calculate a tuning voltage $V_n$ of a desired channel n, as shown in FIG. 2. In which case, it is desirable that the above-mentioned two points Va and Vb are separated from each other as much as possible with respect to the channel number in order to accurately obtain an inclination of the frequency-tuning voltage characteristic curve shown in FIG. 2.

What is claimed is:

1. An automatic tuning method used in an automatic tuning apparatus of a receiver, which supplies to a tuning unit a tuning voltage for a desired receiving channel among a plurality of receiving channels of a receiving frequency band of the tuning unit to optimize a tuning thereof, which method comprising the steps of:

obtaining a pair of tuning voltages at a first frequency corresponding to a lower order channel of the receiving frequency band and a second frequency corresponding to a higher order channel of the receiving frequency band at which optimal tuning conditions of tuning points are obtained in said tuning unit when said tuning unit is adjusted;

storing said pair of tuning voltages corresponding to said first and second frequencies in a storage means as reference tuning voltages used to determine a tuning voltage of any desired receiving channel within the receiving frequency band;

converting said pair of tuning voltages according to a predetermined procedure to determine a tuning voltage corresponding to a frequency of said any desired receiving channel when selectively receiving said any desired receiving channel among said two or more receiving channels; and supplying the determined tuning voltage to said tuning unit, thereby optimizing the tuning for any desired receiving channel in said receiving frequency band.

2. The automatic tuning method according to claim 1, wherein said first frequency and said second frequencies are frequencies of a channel in the vicinity of a channel in the lowest order and a channel in the vicinity of a channel in the highest order, respectively, in the receiving frequency band.

3. The automatic tuning method according to claim 1, wherein said plurality of receiving channels within the receiving frequency band are arranged at predetermined uniform spacings of frequency.

4. The automatic tuning method according to claim 1, wherein said tuning voltage corresponding to said desired receiving channel is determined by calculating a predetermined equation on the basis of the number of channels included in a range between said pair of reference tuning voltages and an order of said desired channel.

5. An automatic tuning method used in an automatic tuning apparatus of a receiver, which supplies a tuning voltage for a desired receiving channel among two or more receiving channels to a tuning unit to optimize a tuning thereof, which method comprising the steps of:

obtaining a pair of tuning voltages at a first frequency corresponding to a channel in a lower order and a second frequency corresponding to a channel in a higher order within a receiving frequency band of said tuning unit at which optimal tuning conditions of tuning points are obtained in said tuning unit when said tuning unit is adjusted;

storing said pair of tuning voltages corresponding to said first and second frequencies as reference tuning voltages used to determine a tuning voltage of the desired channel within the receiving frequency band in a storage means;

determining a tuning voltage corresponding to a frequency of the desired receiving channel according to an order of the desired receiving channel on the basis of said values of said pair of tuning reference voltages stored in said storing means when selectively receiving the desired receiving channel among said two or more receiving channels; and supplying the determined tuning voltage to said tuning unit, thereby optimizing the tuning for the desired receiving channel, wherein said first frequency and said second frequencies are frequencies of a channel in the lowest order and a channel in the highest order, respectively, within the receiving frequency band.

6. An automatic tuning apparatus of a receiver supplying a tuning voltage for a desired receiving channel among a plurality of receiving channels of a receiving frequency band to optimize a tuning thereof, comprising:

a tuning unit for obtaining a pair of tuning voltages at a first frequency corresponding to a lower order channel within the receiving frequency band of said tuning unit and a second frequency corresponding to a higher order channel within the receiving frequency band of said tuning unit at which optimal tuning conditions of tuning points are obtained in said tuning unit when said tuning unit is adjusted;

a storing means for storing values of said pair of tuning voltages corresponding to said first and second frequencies as reference tuning voltages; and a voltage converting means for converting said pair of tuning voltages stored in said storing means according to a predetermined procedure to determine a tuning voltage corresponding to a frequency of any desired receiving channel within said receiving frequency band when said receiver selectively receives said any desired receiving channel within said receiving frequency band.

7. The automatic tuning apparatus according to claim 6, wherein said storing means is a ROM.

8. The automatic tuning apparatus according to claim 7, wherein said voltage converting means is a digitally operating means for determining a tuning voltage of the desired receiving channel on the basis of the values of said pair of reference tuning voltages read out from said storing means, the number of channels included in a region between said pair of reference tuning voltages and an order of the desired channel using a predetermined equation.

9. The automatic tuning apparatus according to claim 7, wherein said first frequency and said second frequencies are frequencies of a channel in the vicinity of a channel in the lowest order and a channel in the vicinity of a channel in the highest order, respectively, in the receiving frequency band.

10. The automatic tuning apparatus according to claim 7, wherein said plurality of receiving channels within the receiving frequency band are arranged at predetermined uniform spacings of frequency.

11. The automatic tuning apparatus according to claim 6, wherein said tuning unit is configured with a variable-capacitance diode and a coil.

12. An automatic tuning apparatus of a receiver supplying a tuning voltage for a desired receiving channel among two or more receiving channels to a tuning unit to optimize a tuning thereof comprising:

a tuning unit for obtaining a pair of tuning voltages at a first frequency corresponding to a channel in a lower order and a second frequency corresponding to a channel in a higher order within a receiving frequency band of said tuning unit at which optimal tuning conditions of tuning points are obtained in said tuning unit when said tuning unit is adjusted;

a storing means for storing values of said pair of tuning voltages corresponding to said first and second frequencies as reference tuning voltages; and a voltage converting means for determining a tuning voltage corresponding to a frequency of said desired receiving channel according to an order of said desired receiving channel on the basis of said values of said pair of reference tuning voltages stored in said storing means when said receiver selectively receives the desired receiving channel among said two or more receiving channels, wherein said first frequency and said second frequencies are frequencies of a channel in the lowest order and a channel in the highest order, respectively, within the receiving frequency band.

* * * * *